US010199274B2

(12) United States Patent
Knechtel et al.

(10) Patent No.: US 10,199,274 B2
(45) Date of Patent: Feb. 5, 2019

(54) ELECTRICALLY CONDUCTIVE VIA(S) IN A SEMICONDUCTOR SUBSTRATE AND ASSOCIATED PRODUCTION METHOD

(71) Applicant: X-FAB Semiconductor Foundries GmbH, Erfurt (DE)

(72) Inventors: Roy Knechtel, Geraberg (DE); Sophia Dempwolf, Niedernissa (DE); Daniela Guenther, Erfurt (DE); Uwe Schwarz, Erfurt (DE)

(73) Assignee: X-FAB Semiconductor Foundries GmbH, Erfurt (DE)

( * ) Notice: Subject to any disclaimer, the term of this patent is extended or adjusted under 35 U.S.C. 154(b) by 0 days.

(21) Appl. No.: 15/483,538

(22) Filed: Apr. 10, 2017

(65) Prior Publication Data
US 2017/0294351 A1   Oct. 12, 2017

(30) Foreign Application Priority Data
Apr. 8, 2016   (DE) .................. 10 2016 106 502

(51) Int. Cl.
| H01L 21/4763 | (2006.01) |
| H01L 21/768 | (2006.01) |
| H01L 23/48 | (2006.01) |
| H01L 23/00 | (2006.01) |

(52) U.S. Cl.
CPC .. *H01L 21/76898* (2013.01); *H01L 21/76876* (2013.01); *H01L 23/481* (2013.01); *H01L 24/11* (2013.01)

(58) Field of Classification Search
CPC .......... H01L 21/6723; H01L 21/31612; H01L 2225/06541; H01L 21/76898; H01L 23/5226
USPC ....... 438/622, 629, 637, 639, 640, 421, 453; 257/622, 623
See application file for complete search history.

(56) References Cited

U.S. PATENT DOCUMENTS

| 3,577,037 A | * | 5/1971 | Di Pietro | ............. H01L 23/147 257/621 |
| 3,648,131 A | * | 3/1972 | Stuby | ................ H01L 21/76898 148/DIG. 135 |
| 3,761,782 A | * | 9/1973 | Youmans | ............. H01L 21/764 148/DIG. 115 |
| 3,821,782 A | * | 6/1974 | Hutson | ............... H01L 23/3157 257/496 |

(Continued)

*Primary Examiner* — S. V. Clark
(74) *Attorney, Agent, or Firm* — Stevens & Showalter, LLP

(57) ABSTRACT

A method is provided for producing at least one electrical via in a substrate, the method comprising: producing a protective layer over a component structure which has been produced or is present on a front side of the substrate; forming at least one contact hole which extends from a surface of a backside of the substrate to a contact surface of the component structure; forming a metal-containing and thus conductive lining in the at least one contact hole creating a hollow electrically conductive structure in the at least one contact hole; and applying a passivation layer over the backside of the substrate, the passivation layer spanning over the hollow electrically conductive structure for forming the at least one electrical via. Also provided is a microtechnical component comprising at least one electrical via.

29 Claims, 4 Drawing Sheets

(56) References Cited

U.S. PATENT DOCUMENTS

| | | | |
|---|---|---|---|
| 4,074,342 A * | 2/1978 | Honn | H01L 23/481 257/717 |
| 5,084,750 A * | 1/1992 | Adlerstein | H01L 23/481 257/197 |
| 2005/0118939 A1 * | 6/2005 | Duescher | B24D 11/00 451/527 |

* cited by examiner

ELECTRICALLY CONDUCTIVE VIA(S) IN A SEMICONDUCTOR SUBSTRATE AND ASSOCIATED PRODUCTION METHOD

FIELD OF THE INVENTION

This disclosure relates generally to the field of production of micro-technical components, e.g. microelectronic, micro-optical, micromechanical component structures, which are produced in and on a substrate and require a via through the substrate for the further interconnection of the component structure.

BACKGROUND OF THE INVENTION

In microelectronics and microsystems technology, apart from reducing the lateral dimensions, i.e. the dimensions in the area of a suitable substrate, e.g. a semiconductor wafer, there is an increasing tendency to also create an interconnection in the dimension perpendicular to the substrates in order to enable an overall three-dimensional integration. Especially the integration of micromechanical systems in combination with CMOS technology plays a central role in this development. Electrical vertical vias are important components for electrically interconnecting component structures, e.g. microelectromechanical structures (MEMS), electronic structures, e.g. CMOS structures including transistors, and the like, to other component structures arranged on the same substrate in different positions, or on an opposite substrate side or on a separate substrate. In such three-dimensional applications, the focus is often on the connection and stacking, respectively, of similar component structures, for example, stacking of memory or logic chips. The so-called heterogeneous integration is also used when striving for a more compact design of larger electronic units, wherein different construction types are connected, e.g. when chips without a housing are directly connected to printed circuit boards.

The vertical electrical via (also referred to as "through-connection") employed for these applications, especially for the through-connection of a semiconductor wafer, is suitable for versatile applications in microelectronics/microsystems technology and is thus provided as a suitable means in many new developments.

In general, an electrical vertical via is to be understood as a narrow hole extending through the semiconductor substrate, the wall of which is provided which an insulation layer and is filled with a conductive material. In recent developments, especially a metal or metal alloy has been used, at least in part, as the conductive material. The conductive material or metal is connected to the nearest contact level and thus achieves the desired conductivity for the via. Usually, it is intended that the dimensions of a via are as small as possible in order to save valuable space on the substrate and to keep the material costs low. When using an electrical via, the design and the production method are often adapted to the specific use of the via. The design of the via and the process control for producing the via are thus often dependent on component structure to be produced or produced which is provided on the substrate front side and/or substrate backside. In this adaptation between the production and type of the via as well as the type and production of the component structures, the time in the process chain, at which the via is produced, is important.

In general, there are three possible times for the production of a via, wherein a mix of these three times is possible in some cases, i.e. only a partial production at certain production times:

Via-First
  The vertical via is produced first and then the component structures, e.g. MEMS/CMOS structures, are produced on the front side and/or backside of the substrate.
Via-Middle
  The production processes for the via are performed during the production of the component structure, but are carried out prior to producing the metallization layers serving the purpose of connecting the individual components of the component structure (BEOL).
Via-Last
  The via is produced only during or after the production of the metallization layers for the component structures.

The policy to be applied is usually selected depending on the component structure to be produced in order to utilize the advantages of the respective policy while minimizing the disadvantages associated therewith in the light of the entire production method. Especially the mechanical and thermal influences of the production processes for the via are of great significance with respect to compatibility with the component structures to be produced or produced, e.g. with the CMOS/MEMS modules.

Thus, the approach "via-first" or "via-middle" is selected for standard applications of vias in order to keep corresponding compatibility problems between the process control for the via and the component structure low.

Due to the numerous different specifications for the applications of vertical vias, usually a corresponding new variant of the via is to be developed for each newly developed technology of the component structures. Already existing process policies for producing the vias are often already specialized too much to enable a modular flexible application. For example, the application field is severely limited by the approach "via-first" or "via-middle", since the contamination of standard semiconductor processes is highly problematic when using metals, such as copper, as an example. In particular, many process plants are equipped with devices for handling the semiconductor wafers on their backsides by means of vacuum, which is why the previously processed wafer backside can be used in such plants in a limited way only. Significant problems also arise with respect to the conductive material of the via. Copper, which is used most often for this purpose, leads to an excessive difference in the temperature coefficient as compared to the semiconductor substrate, and it also diffuses into the adjacent material structures until a copper saturation is achieved therein, unless corresponding protective intermediate layers are provided. These properties of copper and also the plastic-elastic properties thereof can lead to considerable problems regarding material separation and adhesion, and/or also contribute to mechanical stress in the various material layers.

Furthermore, the effect of the surrounding atmosphere on copper layers is typically associated with a temperature-dependent oxidation of this layer which is to the disadvantage of conductivity.

The deposition of layers in vertical vias for greater aspect ratios can also be realized with great difficulty only, especially when a relatively complex layer structure, as in copper, is required.

Especially in the case of great aspect ratios, common methods for layer deposition reach their limits in terms of the deposition rates to be achieved and the expenditure of time required as a result, which limits are incompatible with the usual standards for mass production.

Substantial costs are incurred with respect to the material when especially copper or tungsten are used as conductive materials for a via.

SUMMARY OF THE INVENTION

It is an object of the (claimed) invention to produce or create an electrical via at low cost and with increased flexibility in terms of the micro-technical semiconductor structures to be interconnected by the via.

According to a first invention, the above-mentioned object is achieved by a method for producing an electrical via in a substrate. The method comprises producing a protective layer over a component structure produced on and/or in a front side of the substrate (when it is already present or exists, it has been produced previously in the sense of the claimed method, which is why the past tense is used in the claim). Further, a contact hole is formed which extends from a backside of the substrate to a contact surface of the component structure. For example, after insulation of the side wall of the contact hole, a metal-containing conductive lining is formed in the contact hole such that a hollow conductive structure is created. A passivation layer is applied over the backside of the substrate, wherein the passivation layer spans the hollow conductive structure.

Owing to the selection of the time of the production of the via (after the component structure has already been produced), the method according to the invention is highly flexible in terms of the process technology to be applied, for example, for producing the component structure. According to the invention the production of the via is thus carried out after completion of a technology or semiconductor top side, e.g. after a CMOS or MEMS process. For example, the method according to the invention is suitable for MEMS components having covers, since, owing to the via, the covers can be placed in unrestricted manner for covering the mechanical structures (substrate).

However, contacts of modules, for example, sensors having a typical plate thickness of 400 μm, can also be created when a connection to glass substrates or a direct connection to printed circuit boards is required.

The method according to the invention can also be used for the stacking of chips and the integration of various technologies. The position of the vertical via in the chip structure can be selected freely in compliance with the design specifications. The realization of the via by means of a lining forming a hollow conductive structure, for example, a hollow cylinder, on the one hand, results in a corresponding reduction of costs due to a more economical, more effective use of the raw material as opposed to a complete filling of the contact hole with the conductive material. On the other hand, the effects which are associated especially with copper and which are to be considered highly problematic in conventional policies, i.e. the plastic-elastic properties of the copper metal, are almost negligible owing solely to the presence of a lining instead of a solid material. Due to the passivation layer spanning the hollow conductive structure, these advantageous properties in terms of the plastic-elastic deformation can be maintained during the further processing and, in particular, when using the component.

In a further advantageous variant, the step of forming a metal-containing lining in the contact hole comprises the following steps: applying a first metal-containing layer as a layer (as a barrier and/or for adhesion), and applying a second metal-containing layer differing from the first layer as a seed layer for a third metal-containing layer. The third metal-containing layer is electro-deposited on the second layer, wherein the first and the second layers are applied under vacuum, and wherein the vacuum is maintained without interruption.

The provision of a plurality of metal-containing layers leads to the desired properties, for example, in terms of adhesion to the side walls of the contact hole, or in terms of possible barrier properties preventing, for example, an undesired diffusion of critical metal atoms, e.g. copper atoms.

In particular or preferably, the first and second metal-containing layers are produced without interruption of the vacuum, wherein especially an in-situ process control is employed, in which intermediate steps, e.g. a wafer transport or other change in position of the wafer, are not required or are at least greatly reduced.

Typically, intermediate cleaning steps can also be omitted so that a process flow with increased safety is thus achieved owing to the reduction of sources of interference. Thus, a reduction of cost and/or time can also be achieved due to the economy of the complex intermediate processes. Avoiding an interruption of the vacuum conditions during the deposition of the first and second metal-containing layers also significantly contributes to the process quality.

In general, the combination of a plurality of deposition processes into a single process enables achievement of a plurality of objects, e.g. barrier and adhesive layers, metallization of the contact hole in combination with the metal deposition for a wiring layer, processes for passivation and soldering stop. A concentrated efficient overall process flow and thus a reduction in cost and/or time are achieved.

In further advantageous embodiments, the first and/or the second metal-containing layers are applied by means of a metal-organic chemical vapor atmosphere.

The method according to the invention is thus applicable to structures of the contact hole having very high aspect ratios. In patent terms, "very high" means ratios of depth (or length) of the contact hole to the diameter of the contact hole, however, at least greater than 8. In particular, the application of metal-organic chemical vapor deposition (MOCVD) provides the possibility to produce a thin conformal layer for the metal-containing material even with these extreme ratios.

When applying the second metal-containing layer serving as a seed layer, the metal-organic chemical vapor deposition yields a substantial advantage, since, owing to the properties of the metal-organic chemical vapor deposition process, a coherent, reliably thin seed layer is created on all exposed surfaces. Possible irregularities of the side-wall topography, which may result from the process and process variations in the production of the contact hole and/or in the deposition of an overlying insulation layer, are covered.

These properties of the metal-organic chemical vapor deposition are also advantageous when applying the first metal-containing layer serving as a barrier and/or adhesive layer, since also in this case a reliable covering of possible irregularities at the respective side wall is achieved. Thus, due to the application of the metal-organic chemical vapor deposition, flexibility and modularity in application at a later point in time of the overall process control, e.g. after completion of the semiconductor devices, can be significantly improved.

In a further advantageous variant, a wiring level is produced on the backside of the substrate (its rear surface) when forming the metal-containing conductive lining. Thus, as already mentioned above, a substantial increase in efficiency of the entire production method can be achieved, since further wiring layer(s), which are required anyhow, can be integrated into the procedure of producing the via.

In a further advantageous embodiment, a surface wetting, preferably with water, is carried out under vacuum conditions prior to the electrodeposition of the third metal-containing layer.

Due to this vacuum pretreatment including a wetting of the exposed surfaces, a homogeneous wetting by the electrolyte for the deposition of the third metal-containing layer is achieved. In this way, a coherent epitaxial growth of the electrolytic layer and thus a reliable conductive lining can be achieved without making the layer thickness unnecessarily large (or thick).

In a further variant, a resist mask including negative resist for defining positions for metal deposition is produced prior to the deposition of the third metal-containing layer.

The resist is applied over the contact hole such that it is only spanned, but not filled so that only very little resist material (as residual resist) has to be removed from the contact hole after deposition of the third layer, which contributes to a decreased processing time and a more efficient removal of residual material.

In a further advantageous embodiment, a maximum process temperature occurring in the production of the via is less than 501° C.

Due to this definition of the maximum process temperature, a high degree of flexibility in the application to possible types of component structures is achieved, since many process technologies employed in the production of the component structure are typically compatible with this temperature range. For example, when a CMOS process is applied for producing the component structure prior to the via, the selected temperature range for the via ensures that the production process of the component structure is not limited thereby.

In a further embodiment, the metal-containing lining is baked out in a non-corrosive atmosphere prior to the application of the passivation layer.

Due to this baking-out process, the metal containing lining as well as further metal structures concurrently produced on the backside of the substrate can be stabilized prior to the further processing, wherein the process temperature is advantageously less than 501° C. during baking-out, as explained above.

In further embodiments, the component structure is produced as a microelectronic structure, and/or a micromechanical structure, and/or an optical structure, and/or an electrical structure, or a microfluidic structure prior to the production of the contact hole. Thus, the versatility of the method according to the invention can be used well, since it is relatively independent of the previously applied process technology and the type of component structure to be produced. In particular, the process parameters for the production of the via are selected such that an adaptation of the process technology to be applied for the component structure to the subsequent production of the via is not required.

In one variant, the substrate is provided as a stack of a plurality of carrier materials connected to each other.

Thus, it is possible to apply the method according to the invention also to three-dimensional structures, in which two or more substrates, e.g. semiconductor substrates, are used, wherein the component structures produced on the respective carrier materials are independent of the production of the vias in terms of the applied process technology and the type of the component structure.

In a further embodiment, the component structure is shielded and/or mechanically or electrically decoupled from a further component structure by producing at least one further via between the component structure and a further component structure, i.e. between two component structures.

Owing to the high flexibility and the efficient decoupling of the production of the via according to the invention from the component type and process technology applicable for the production of the component structures, the via can also be produced for the purposes of shielding and/or decoupling in substrates without having a substantial effect on the previous production processes for the component structure.

Due to a freely selectable lateral position of the via on or in the substrate and owing to the favorable mechanical and thermal properties, as already mentioned above, the vias according to the invention may be provided in a suitable number and in a suitable position in order to achieve other objects, e.g. thermal and mechanical objects, which do not necessarily require an electrical interconnection to existing conductive structures.

According to a further invention, the above-mentioned object is achieved by a micro-technical component. The component comprises a substrate having a front side and a backside, wherein a component structure including at least some structural elements with lateral dimensions of less than 10 μm is formed on and/or in the front side. An electrically conductive via is provided which extends from the backside (more precisely, the surface thereof) to a connection surface on the front side and which is formed as a hollow conductive structure. The electrical conductivity of the via is based on a metal-containing lining of a contact hole through the substrate.

Due to its design, the electrical via is able to provide a high conductivity, on the one hand, by including a metal-containing lining which comprises, for example, copper, a copper alloy and the like, while avoiding undesired side effects associated with (completely) filled vias, on the other hand. For example, plastic-elastic properties, as can be found in many metals, which may contribute to significant stresses in other component layers, for example metallization layers or similar layers, in conventional components. In addition, due to the hollow design of the via according to the invention, material savings can be achieved which, in turn, has a favorable effect on the production costs involved.

In an advantageous further embodiment, an insulating cover is provided over the via on the backside so that the hollow conductive structure is covered. In this way, the electrical via can be reliably protected in a possible further processing and during use, while maintaining the mechanical properties, i.e. low susceptibility to deformations of the metal material.

In an advantageous variant, a diameter of a non-filled area of the via is greater than a size of one or two layer thicknesses of the lining. By this measure it is achieved that the effect of a possible plastic-elastic deformation of the metal material of the lining in relation to the total size of the via is kept low.

The layer thickness of the metal-containing lining is conveniently selected such that, with respect to a conductivity to be achieved, the contribution to a possible mechanical effect on other layer systems is kept low, since corresponding deformations and the like within the via substantially act inwards and thus hardly strains surrounding areas.

In advantageous embodiments, an aspect ratio of the via is greater than or equal to 8 (or 8 to 1, eight units in height/length and one unit in transverse or width) so that highly space-saving vias can be provided. In other advantageous embodiments, the aspect ratio of the via is less than 8 so that the same type of via can be used for numerous different connection policies or component types.

In an embodiment, the micro-technical component comprises two or more electrically conductive vias which are provided laterally adjacent to the component structure and are arranged as at least one shielding element and/or as at least one element for electrically or mechanically decoupling the component structure from a further component structure.

A further invention is a micro-technical component. It comprises a substrate having a front side and a backside, wherein a component structure including at least some structural elements with lateral dimensions of less than 10 µm is formed on and/or in the front side. Electrically conductive vias are provided, wherein the vias extend from the backside to a connection surface on the front side, comprise a metal-containing lining each, and thus form a hollow conductive or conducting structure each.

Owing to the possible space-saving design and the mechanically favorable properties, the vias of the present invention can be advantageously used for numerous different purposes in a carrier material, e.g. for specifically influencing thermal and mechanical properties, e.g. when stacking two or more carrier substrates, for enabling an efficient electrical decoupling of a component structure, and/or, in general, for providing a shielding to be provided, for example, in suitable positions with respect to a component structure.

Owing to the efficient structure and due to the highly flexible method for producing the same, the via according to the invention can be used for numerous different component structures, carrier substrates or the like.

BRIEF DESCRIPTION OF THE DRAWINGS

Embodiments will now be described in greater detail with reference to the accompanying drawings. Embodiments of the invention are illustrated by one or more examples and not in a way that transfers or incorporates limitations from the Figures into the patent claims, even if "especially", "for example", or "e.g." is not mentioned in all places. Same reference numerals in the Figures indicate similar elements.

DETAILED DESCRIPTION OF THE INVENTION

These—and further—embodiments will be described in detail. Initially we alternately refer to FIG. 1 and FIG. 2.

Figure 1:
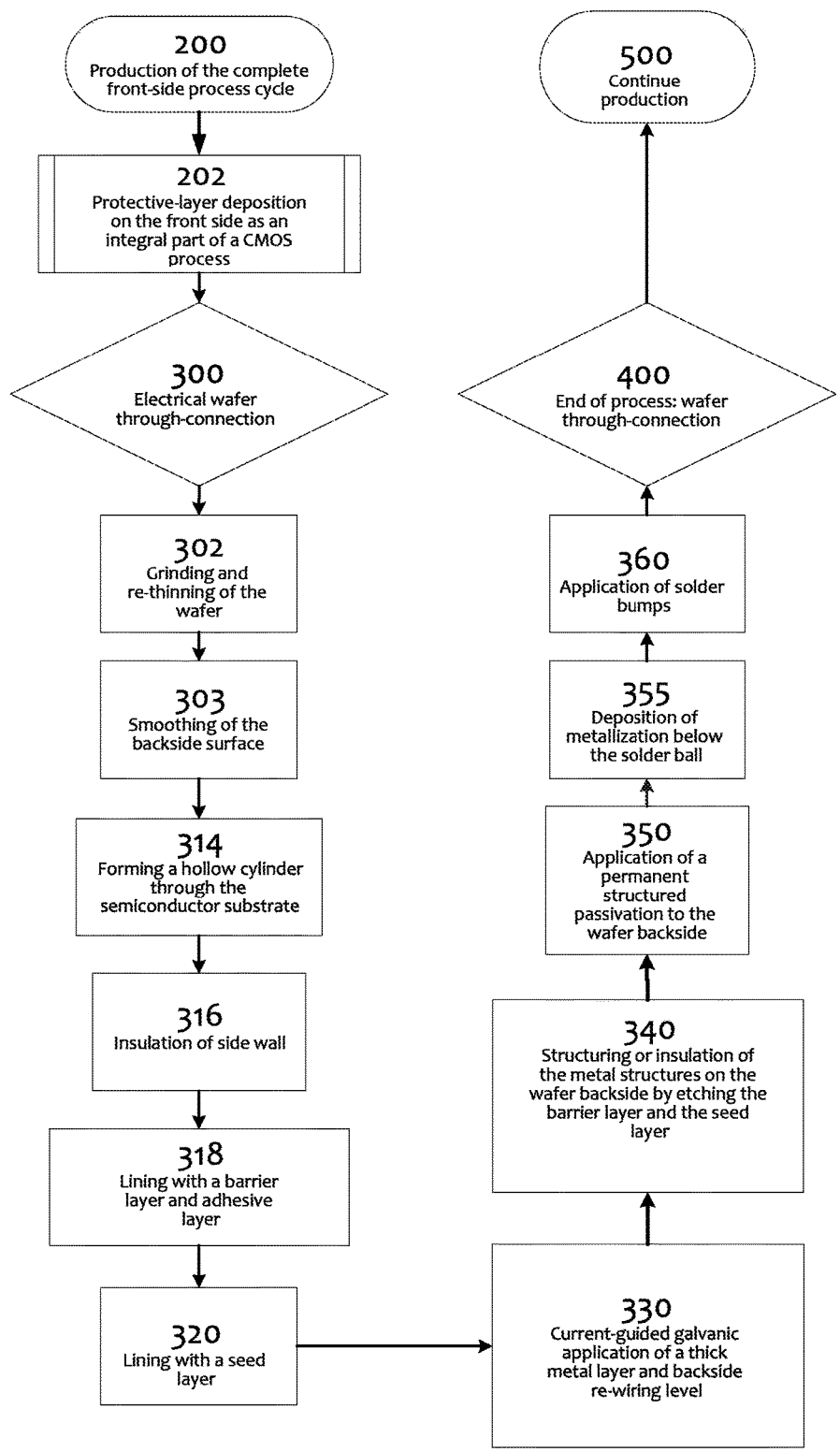
FIG. 1 is a functional flow diagram of an example of a method according to the invention for producing an electrical via, in which some optional steps are also shown.

FIG. 1 schematically shows an exemplary process flow for producing a component structure including a subsequent production of an electrical via. As shown, a complete front-side process cycle 200 is initially performed, in which the desired component structure, for example, a CMOS structure, a MEMS structure is produced in combination with electronic components, etc. For this purpose, the process technologies required for this are employed, as described above, without having to consider the subsequent production of the via(s).

Figure 2:
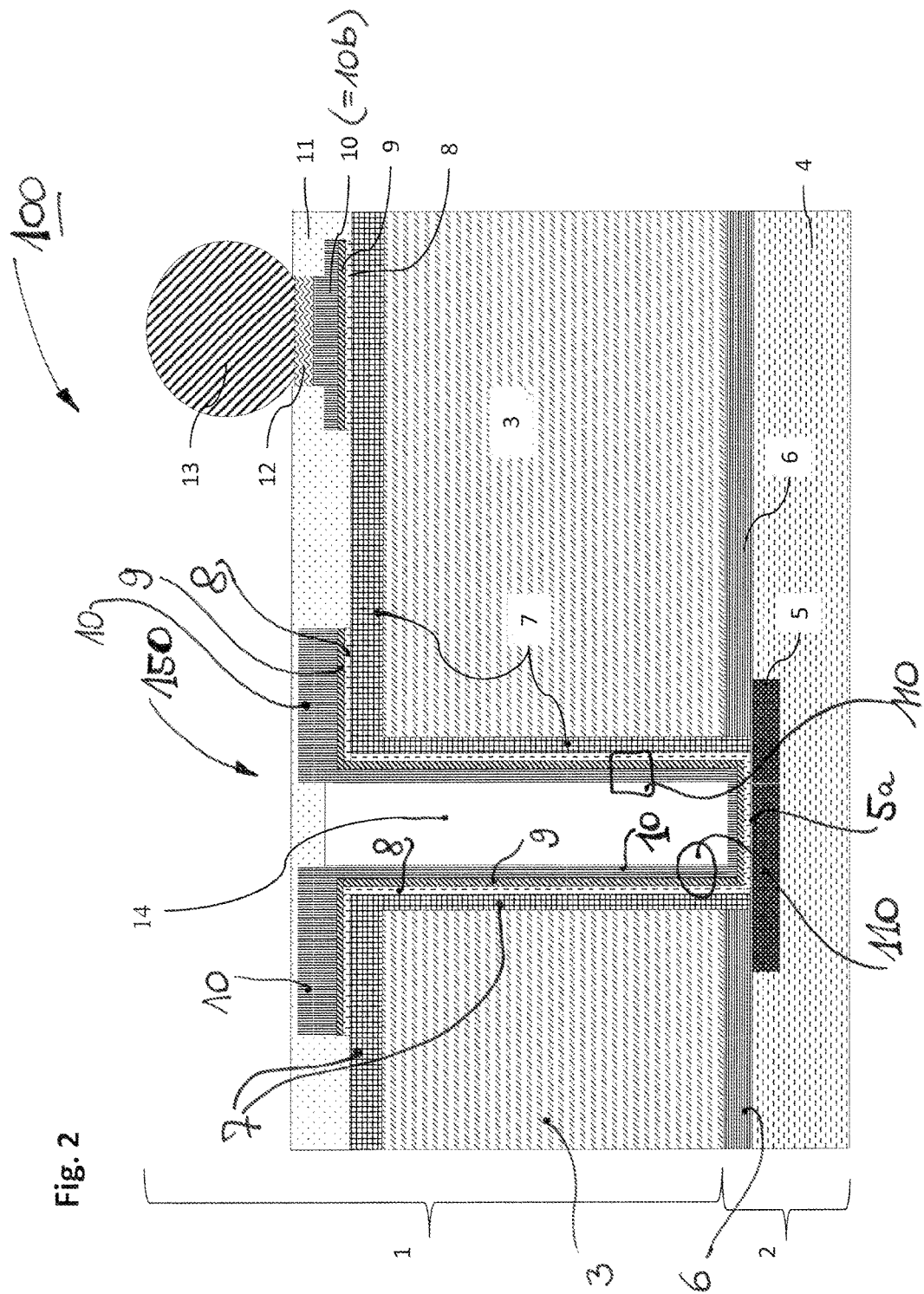
FIG. 2 is a cross-sectional view of a substrate 3 including an electrical via 150 according to an example of the invention.

FIG. 2 shows a cross-sectional view of a component 100 in this regard, which component is referred to as a micro-technical component in order to thus describe that at least some sizes of structural elements, e.g. semiconductor devices or the like, include dimensions of 10 µm or less. The term "micro-technical" component thus includes any component carrying component structures which have a micro-mechanical, microelectronic, optoelectronic, optical, and/or electrical function, or microfluidic function, and dimensions within the range specified above. The micro-technical component 100 comprises a substrate 3, e.g. a semiconductor substrate, or any other substrate having a front side 2 and a backside 1.

The substrate 3 has a suitable thickness, such as in the range of several 100 µm, as is typical for the production of, for example, microelectronic component structures.

As explained above with reference to FIG. 1, the production of a component structure 5 or 5' has already been completed, which component structure is represented merely as a contact surface 5a in the drawing of FIG. 2, wherein it is to be noted that, in addition to the contact or connection surface 5a, further structural elements may typically form even a highly complex component structure. The process technologies employed for this purpose are dependent on the component structure to be produced which is also supposed to be indicated by reference numeral 5 or 5' in FIG. 4.

In the shown embodiment, for example, an insulation layer 6 is provided in connection with the contact surface 5a which is thus supposed to be representative for other component structures.

Again referring to FIG. 1, the second step describes the production 202 of a protective layer 4 on the front side, wherein this procedure may still be considered as a part of the process flow 200 for the production if required. For example, a corresponding protective layer is produced as an integral part of a CMOS process flow. The protective layer 4 is thus deposited over the entire front side of the substrate 3 and prevents that the already produced component structure 5 is damaged by the further production processes 300 to 400 for the electrical via.

In other embodiments, the deposition of the protective layer 4 can also be performed at any other time prior to the further processes for the production of the via(s).

Regardless of whether the deposition of the protective layer 4 is considered an integral part of the production process 202 or as an integral part of the method for the production of the via, the flow continues by processing the backside 1 of the substrate 3 according to one embodiment. For this purpose, the backside 1 is ground to the desired thickness, step 302, and smoothed, step 303, which can be achieved by a spin-etching method.

Then, a mask layer is produced on the backside 1 (on the surface of the backside) which is composed of a suitable material in order to withstand the subsequent procedure for forming a contact hole 14. Usually, materials, such as silicon dioxide, silicon nitride, a mixture thereof, or the like, are used for this purpose, wherein these materials are typically referred to as hard mask. Then, a contact hole 14 is formed from the (top side of the) backside 1 of the substrate 3 by deep reactive ion etching (DRIE), step 314, wherein the etching can typically be performed in a plurality of stages and results in flank angles of 90°±5° in some embodiments. This anisotropic etching is selectively performed such that it stops, for example, at and in the insulation layer 6 below the contact surface 5a of the component structure 5 produced on the front side 2.

In a further reactive ion etching process, the residual portion of the insulation layer 6 exposed in the contact hole 14 is removed from the bottom of the contact hole so that the contact surface 5a is exposed there or becomes electrically accessible from the contact hole.

FIG. 2 schematically shows a contact hole 14 which extends through the backside 1 of the substrate 3 to the front side 2 and is formed through the insulation layer 6 and is thus in contact with the contact surface 5a of the component structure 5.

Furthermore, the side wall of the contact hole 14 and the top side of the backside 1 are covered by an insulation layer 7, step 316, which is made of an oxide based on an ethyl ester, called tetraethyl orthosilicate or tetraethoxysilane (TEOS).

The production can be carried out on the basis of common deposition processes, wherein—as explained above—especially process temperatures are selected such that they are compatible with the already produced component structures 5 or 5' on the front side 2. In advantageous embodiments, a maximum process temperature is kept at less than approx. 500° C. (i.e. less than 501° C. in order to avoid the term "substantially") during the entire process flow for producing the via 150 including the contact hole 14.

The (inner) insulation layer 7 is then removed from the bottom of the contact hole 14, e.g. by an reactive ion etching so that preferably material is removed from the bottom of the contact hole 14 without needlessly removing material from the side walls of the contact holes. Thus, the contact surface 5a of each component structure is re-exposed so that a conductive connection to the respective contact surface 5a is enabled while ensuring a reliable insulation of the side walls (the surfaces thereof) from the substrate 3 and also from other structures which may be present on the backside 1. Due to the insulation layer 7, certain properties of the via can be set, e.g. the breakover voltage or the leakage current.

FIG. 2 further shows a first metal-containing layer 8 which, when applied in step 318, lines the contact hole 14 and which is also present on the surface of the backside 1. In one embodiment, the first metal-containing layer 8 is composed of titanium nitride having a thickness of several nm to several 10 nm depending on the desired layer structure for the via 150.

In the illustrative embodiment, the first layer 8 serves as a barrier and adhesive layer which, on the one hand, prevents undesired diffusion of metal ions of a subsequently applied metal layer into adjacent areas and, on the other hand, ensures excellent adhesion of the subsequently applied metallic material.

A second metal-containing layer 9 is shown in the example, which is applied on top of the metal-containing layer 8 and has a suitable thickness which, as a "seed layer", enables a reliable subsequent electrodeposition process. In one embodiment, the second layer 9 includes copper in case a layer to be deposited subsequently also contains copper. Depending on the desired material structure, other metal-containing materials can also be used as the seed layer 9.

In an advantageous embodiment, the two layers 8 and 9 are produced in an in-situ process flow, wherein the process flow is executed without interruption of the vacuum conditions in a process plant so that the efforts for handling the substrate and for cleaning the process plant between the individual deposition processes are minimized.

In an illustrative embodiment, the first layer 8 is deposited by means of a metal-organic chemical vapor phase (MOCVD 1) so that a conformal thin material layer is formed which forms a reliable barrier against migration of metal to adjacent areas. Furthermore, due to the application of metal-organic chemical vapor deposition, excellent adhesion of layer 8 to metal can be achieved, for example, for enabling sufficient stability and adhesion of the second layer 9 which serves as a seed layer for the subsequent electrodeposition.

In an advantageous embodiment, a metal-organic chemical vapor phase (MOCVD 2) is used also for the deposition of the second layer 9 which, when applied in step 320, lines the contact hole 14 so that also in this case a conformal thin layer is achieved even for great aspect ratios of the contact hole 14. This seed layer 9 is useful for the growth and epitaxial growth of the metal layer 10 to be electro-deposited subsequently. In alternative embodiments, physical vapor deposition (PVD) can be used instead of MOCVD.

Especially when applying MOCVD, the process parameters for the deposition of layer 8 and/or layer 9 can be selected such that the desired surface properties are maintained and a reliable covering even of irregularities of the side walls is achieved, wherein typically a layer thickness of less than 100 nm is sufficient for each layer.

FIG. 2 further shows a third metal-containing layer 10 which is formed on the side walls and the bottom of the contact hole 14 as well as in defined areas on the surface of the backside 1. The third metal-containing layer 10 is composed of a well-conducting material so that the substantial conductivity of the lining 110 of the contact hole 14, which is formed of layers 8, 9 and 10, is determined thereby. The via 150 thus has a hollow conductive structure 110, i.e. formed in the contact hole 14 by layers 8, 9 and 10, which structure has an electrical connection to the contact surface 5a and thus to the corresponding component structure 5.

As further shown in FIG. 2, layers 8, 9 and 10 are also formed in other areas of the top side of the backside 1 so that this layer system concurrently also forms the basis for a wiring layer on the (top side of the) backside 1 of the substrate 3.

As also illustrated by FIG. 1, the third metal-containing layer 10 is produced by initially applying a mask layer (not shown) to the structure, wherein those positions are exposed in which the material layer 10 is to be deposited. A corresponding mask layer can be produced, for example, as a resist mask.

In an advantageous embodiment, the resist mask is made of negative resist in order to define the corresponding positions for the deposition of the well-conducting metal-containing material. The resist mask is produced such that the contact hole 14 is not filled but spanned. Thus, only very little residual resist has to be removed from the contact hole 14 after exposure of the resist, thereby reducing the respective efforts in removing the resist mask and the subsequent cleaning.

In a further illustrative embodiment, the backside 1 of the substrate 3 and thus also the side walls and the bottom of the contact hole 14 are subjected to a vacuum treatment and a wetting with a fluid, e.g. water, so that a homogeneous wetting by the electrolyte is achieved for a subsequent electrodeposition.

The electrodeposition can be performed, for example, as a current-guided plating in step 330, wherein the previously deposited layer 9 serves as a current distribution layer. In this way, the material of layer 10 is reliably deposited within the contact hole 14 and on horizontal areas in the desired positions, thereby creating a hollow conductive structure in depth which is represented by the contact hole 14, the conductivity of which is substantially determined by the material of layer 10.

When the contact hole 14 has a substantially round cross-sectional shape, i.e. when sectioned in the plane perpendicular to the plane of the drawing of FIG. 2, substantially a hollow cylinder is thus created. However, it is to be noted that, depending on criteria to be met, the contact hole 14 may have corresponding flank angles, especially during anisotropic etching through the substrate 3, or corresponding cross-sectional shapes of the contact hole 14 can be set. For example, bulged cross-sections or the like can be realized when this is considered advantageous for the general function of the via 150. Especially the conformal deposition methods based on the afore described metal-organic chemical vapor deposition of layers 8 and 9 achieve a reliable covering of the side wall of each contact hole 14 (two of which in the example).

In advantageous embodiments, the material of layer 10 galvanically deposited in a current-guided manner forms the structure for the entire backside wiring levels 10a and 10b of the component 100 so that no additional deposition steps are required for providing a suitable contact structure on the surface of the backside.

Figure 3:
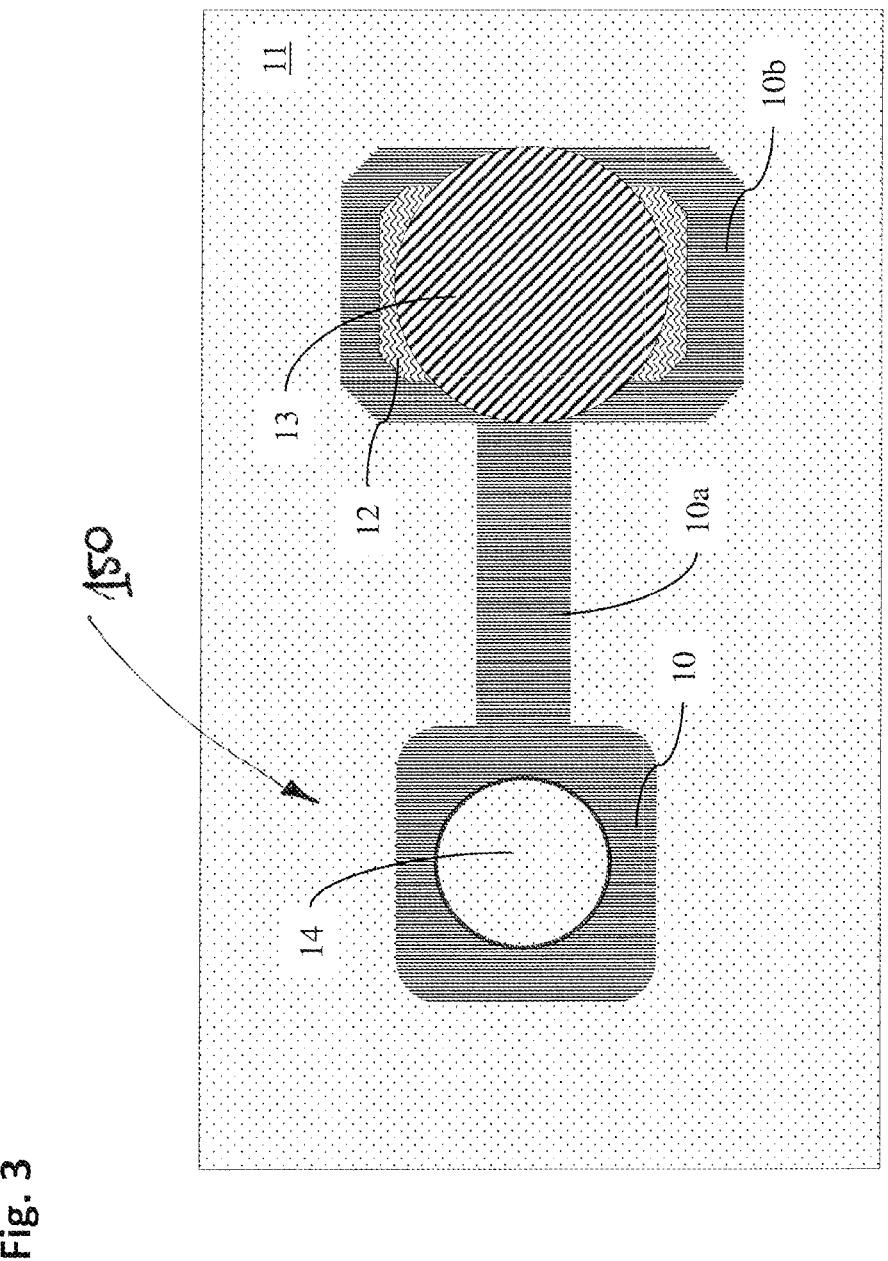
FIG. 3 is a top view of the surface of the backside 1 of the substrate 3 including an electrical via 150 and a wiring structure for interconnecting the via to a solder bump structure 13.

As described by FIG. 1 and shown in FIG. 2 and FIG. 3, corresponding wiring levels 10a and 10b are represented on the surface of the backside 1 in the illustrated embodiment.

These wiring levels are supplemented with a permanent passivation layer 11 which, on the one hand, covers the via 150, i.e. contact hole 14 and the hollow conductive structure 110, respectively, without completely filling the same and, on the other hand, passivates the other areas especially those of the wiring levels 10a and, in part, 10b produced concurrently with the via 150.

In the further steps for producing the structure illustrated in FIG. 2, as also shown by FIG. 1, the resist mask used for electrodeposition of the material of layer 10 is removed, wherein resist removal processes known (common) per se can be applied, thereby re-exposing layers 8 and 9 on the backside 1. This procedure for removing material of layers 8 and 9 can be performed without a mask, where appropriate, since the layer thickness of layers 8, 9 is very low as compared to the thickness of layer 10 which serves as a mask in the illustrated embodiment. In other embodiments, a further resist mask can be produced prior to the etching of layers 8 and 9, if required.

After a corresponding structuring or insulation of the metal structures on the backside by etching the barrier and adhesive layer 8 and the seed layer 9 in step 340 in combination with optional cleaning steps, a baking-out process for stabilizing the metal layer 10 is performed in a non-corrosive vapor atmosphere in illustrative embodiments, wherein the process temperature is less than 501° C., as already explained above.

In a further embodiment, the passivation layer 11 is applied in step 350, wherein one or more suitable materials are deposited by processes known per se. The process parameters are defined such that merely a covering of the via 150 without or without substantial introduction of material into the contact hole 14 is carried out so that the contact hole 14 and the hollow conductive structure 110 of the via 150, respectively, are spanned.

Apertures are produced by masking steps at the corresponding positions, for example, at the position of the solder bump 13 in the passivation layer 11, whereupon an "under metallization" 12 is deposited in step 355. For example, a nickel/gold material can be applied in a desired thickness by using an electroless electrodeposition in order to produce the under metallization 12 of the solder bump 13.

The selection of materials for the under metallization 12 and the number of partial layers for the under metallization 12 may vary depending on design criteria or the like. Then, the material for the solder bump 13 is applied in step 360, which is performed on the basis of a mask or even without a mask, followed by fusing in order to obtain the desired shape of the solder bump(s) 13.

Thus, the procedure of producing the wiring levels and the via 150 is completed in step 400.

As explained with reference to FIG. 1, further processes 500 for processing the component 100 will now follow, if required.

FIG. 3 schematically shows a top view of the backside 1, wherein the via 150 including the hollow conductive structure 110 in the contact hole 14 is electrically connected to the solder bump 13 by means of the third metal-containing layer 10 and the non-visible layers 8, 9. In the FIGURE, this connection is illustrated as a conductive path 10a. As explained above, the corresponding conductive paths 10a can desirably be produced as a part of the electrodeposition for the lining of the contact hole 14 for the via 150 in order to thus form the wiring level(s) on the backside.

It should be noted that not each via 150 is necessarily connected to a corresponding solder bump.

For example, a plurality of vias 150 can be provided in suitable positions so that, for example, a shielding of sensitive areas in and on the substrate 3, a mechanical decoupling of certain substrate areas, and/or a thermal coupling to possible heat sinks, and/or an electrical decoupling etc. is/are achieved.

In particular, the compact design and the relative independence of process technologies applied for producing the component structures enable a selection of the positions of the vias 150 with and without electrical interconnection to a corresponding contact surface 5a on the front side, and/or an electrical connection to a contact point, e.g. a solder bump 13, on the backside.

Figure 4:
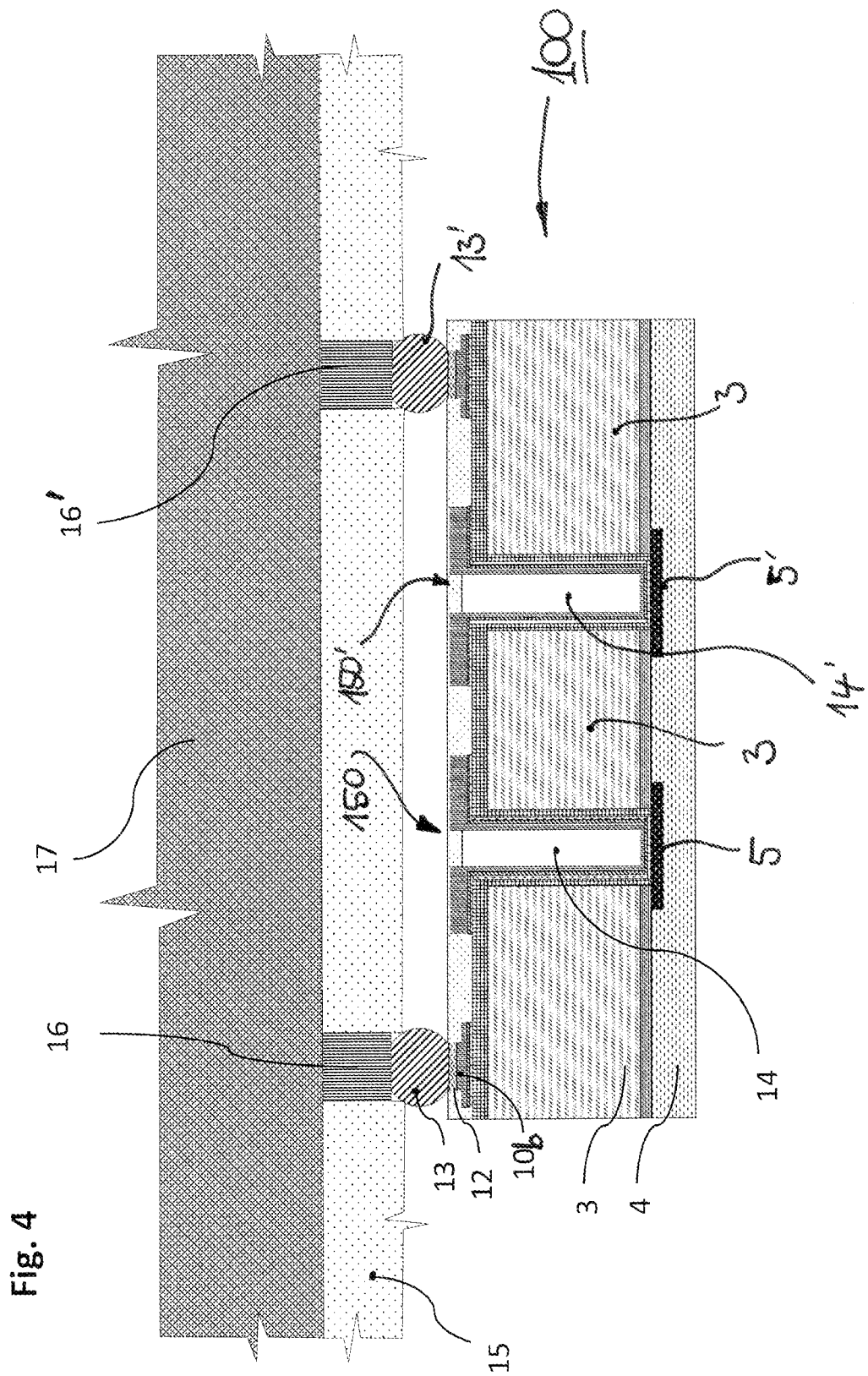
FIG. 4 is a cross-sectional view of a substrate 100 including a plurality of electrical vias (contact holes 14, 14'), a backside wiring layer and a printed circuit board 17 connected to the backside wiring layer via solder bumps 13, 13' in electrically conductive manner.

FIG. 4 schematically shows a cross-sectional view, in which the component 100 comprises vias 150, 150' which include the hollow conductive structures 110 in the contact holes 14, 14', and which are provided in a manner connected to a component structure 5 or 5' and/or are arranged in the vicinity thereof in order to fulfill a corresponding function, e.g. an electrical interconnection, a mechanical interconnection, a shielding or the like. One or more vias 150, 150' can be connected to one or more solder bumps 13, 13', as specified by the design rules.

A printed circuit board 17 has suitable contact points 16, 16' which are connected to the correspondingly associated solder bumps 13 or 13' in an electrically conductive manner, wherein a passivation 15 of the printed circuit board 17 is provided (on the side of the solder bumps). Connecting the printed circuit board 17 to the at least one component 100 (also called chip) can be accomplished by reflow soldering or other contacting methods. The "suitable" contact points 16 are to be understood such that they enable a spatial-geometrically fitting docking to the solder bumps in order to produce conductive contact(s) to the printed circuit board 17.

The examples of the invention thus provide methods and components in which a via is produced on the basis of a process flow which is not specifically tailored to production technologies for semiconductor devices.

Thus, the corresponding components in the form of mechanical, electrical, optoelectronic, and/or optical components are completely processed before starting actual production of the via. Due to a suitable selection of process parameters, especially with respect to the maximum process temperature occurring in the production of the via, a high degree of flexibility is achieved in terms of the process technologies to be applied previously.

In particular, a well-conducting material in the form of a lining of a contact hole is provided for the via so that, in total, at least one hollow conductive structure is produced, which is much less subject to the problems of plastic-elastic deformation, as is known, for example, for completely or almost completely filled copper vias. At the same time, a high degree of material saving is achieved.

In advantageous embodiments, especially several layers of the conductive lining are produced by means of a metal-organic vapor phase in an in-situ process so that a high degree of reliability is achieved in the processing and in the production of a thin, but yet covering material layer as a basis for the subsequent deposition of the actual conductive material.

What is claimed is:

1. A method of or for producing at least one electrically conductive via in a substrate, the method comprising the following steps:
   producing a protective layer over a component structure which has been produced or is present on a front side of the substrate;
   forming at least one contact hole which extends from a surface of a backside of the substrate to a contact surface of the component structure;
   forming a metal-containing conductive lining in the at least one contact hole by:
      applying a first metal-containing layer as one of a barrier layer or an adhesive layer;
      applying a second metal-containing layer as a seed layer for a third metal-containing layer, wherein the second metal-containing layer differs from the first metal-containing layer and the first and the second metal-containing layers are applied under vacuum; and
      electro-depositing the third metal-containing layer on the second metal-containing layer, whereby a hollow electrically conductive structure is created in the at least one contact hole; and
   applying a passivation layer over the backside of the substrate, the passivation layer spanning over the hollow electrically conductive structure to form the at least one electrically conductive via in the substrate.

2. The method according to claim 1, wherein forming the metal-containing conductive lining in the at least one contact hole comprises maintaining the vacuum without interruption at least during application.

3. The method according to claim 1, wherein at least the second metal-containing layer is applied by a metal-organic chemical vapor atmosphere.

4. The method according to claim 3, wherein the first metal-containing layer is applied by a metal-organic chemical vapor phase.

5. The method according to claim 1, wherein a backside wiring level is produced on the backside of the substrate when forming the metal-containing conductive lining.

6. The method according to claim 1, wherein a surface wetting with a fluid is carried out under vacuum conditions prior to the electro-deposition of the third metal-containing layer.

7. The method according to claim 1, wherein a resist mask including negative resist for defining positions for metal deposition is produced prior to the electro-deposition of the third metal-containing layer.

8. The method according to claim 1, wherein a maximum process temperature occurring in the production of the at least one electrically conductive via is less than 501° C.

9. The method according to claim 1, wherein the metal-containing conductive lining is baked out in a non-corrosive atmosphere prior to applying the passivation layer.

10. The method according to claim 1, wherein the component structure is produced prior to the forming of the at least one contact hole.

11. The method according to claim 1, wherein the substrate is provided as a stack of a plurality of carrier materials connected to each other.

12. The method according to claim 1, wherein the component structure is one of shielded, mechanically decoupled, or electrically decoupled from a further component structure by producing at least one further hollow conductive structure as a via including a conductively lined contact hole laterally between the component structure and the further component structure.

13. The method according to claim 10, wherein the component structure is one of a microelectronic structure, a micromechanical structure, an optical structure, an electrical structure, or a microfluidic structure.

14. The method according to claim 1, wherein the passivation layer is applied which includes apertures or a local structuring adapted for a later coating with further metal layers or suitable for placing solder bumps over the backside of the substrate, which passivation layer spans the hollow electrically conductive structure.

15. The method according to claim 14, wherein placing solder bumps comprises fusing the solder bumps and wherein fusing the solder bumps is performed and configured for a later mechanical and electrical connection of the substrate or a finished chip to a printed circuit board.

16. The method according to claim 1, wherein forming the at least one contact hole is followed by forming an insulation layer on the backside of the substrate, which insulation layer completely lines the at least one contact hole and is locally remote from the contact surface.

17. The method according to claim 1, wherein the at least one contact hole is a deep or elongate contact hole.

18. The method according to claim 17, wherein an aspect ratio of the at least one electrically conductive via is greater than or equal to eight, or is 8 to 1.

19. The method according to claim 1, wherein a plurality of spaced apart contact holes or vias are formed in the substrate.

20. A micro-technical component comprising a substrate and having a front side and a backside, wherein
   a component structure including at least some structural elements with lateral dimensions of less than 10 µm is formed on the front side;
   at least one electrically conductive via extending from a surface of the backside to a connection surface of the component structure is provided; and the at least one electrically conductive via comprises a metal-containing lining, thereby forming a hollow conductive structure, wherein an aspect ratio of the at least one electrically conductive via is greater than or equal to eight.

21. The micro-technical component according to claim 20, comprising an insulating cover over the at least one electrically conductive via on the backside so that the hollow conductive structure is covered.

22. The micro-technical component according to claim 20, wherein a diameter of a non-filled area of the hollow conductive structure is greater than a layer thickness of the metal-containing lining.

23. The micro-technical component according to claim 20, wherein a plurality of electrically conductive vias are provided, each of which comprises a respective metal-containing lining thereby forming a plurality of hollow conductive structures.

24. The method according to claim 15, wherein the solder bumps dock to contact points of the printed circuit board in a spatial-geometrically fitting manner in order to produce conductive contacts to the printed circuit board.

25. The micro-technical component according to claim 22, wherein the diameter is greater than two layer thicknesses of the metal-containing lining.

26. The method according to claim 1, wherein the hollow electrically conductive structure comprises a hollow cylinder.

27. The micro-technical component according to claim 20, wherein the hollow conductive structure comprises a hollow cylinder.

28. A micro-technical component comprising a substrate and having a front side and a backside, wherein a component structure including at least some structural elements with lateral dimensions of less than 10 µm is formed on the front side;

at least one electrically conductive via extending from a surface of the backside to a connection surface of the component structure is provided; and the at least one electrically conductive via comprises a metal-containing lining, thereby forming a hollow conductive structure, wherein the at least one electrically conductive via comprises two or more electrically conductive vias provided laterally adjacent to the component structure as one of shielding elements, elements for electrically decoupling, or elements for mechanically decoupling the component structure from a further component structure.

29. The micro-technical component according to claim 28, wherein the hollow conductive structure comprises a hollow cylinder.

* * * * *